United States Patent
Feng et al.

(10) Patent No.: US 11,361,715 B1
(45) Date of Patent: Jun. 14, 2022

(54) SHIFT REGISTER UNIT, GATE DRIVING CIRCUITRY AND METHOD FOR DRIVING THE SAME

(71) Applicants: Hefei BOE Joint Technology Co., Ltd., Hefei (CN); BOE Technology Group Co., Ltd., Beijing (CN)

(72) Inventors: Xuehuan Feng, Beijing (CN); Yongqian Li, Beijing (CN); Pan Xu, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/352,319

(22) Filed: Jun. 20, 2021

(30) Foreign Application Priority Data

Dec. 16, 2020 (CN) .......................... 202011486516.3

(51) Int. Cl.
*G09G 3/36* (2006.01)
*G09G 3/3266* (2016.01)
(Continued)

(52) U.S. Cl.
CPC ......... *G09G 3/3266* (2013.01); *G09G 3/3225* (2013.01); *G11C 19/28* (2013.01);
(Continued)

(58) Field of Classification Search
CPC ..... G09G 2310/0286; G09G 2310/027; G09G 2330/021; G09G 3/3648;
(Continued)

(56) References Cited

U.S. PATENT DOCUMENTS 5,990,857 A * 11/1999 Kubota ................ G09G 3/3666
345/98
2003/0174115 A1 * 9/2003 Washio ................ G09G 3/3688
345/98
(Continued)

FOREIGN PATENT DOCUMENTS

CN 102157126 A 8/2011
CN 102708777 A 10/2012
(Continued)

OTHER PUBLICATIONS

CN2020114865163 First Office Action.

*Primary Examiner* — Duc Q Dinh
(74) *Attorney, Agent, or Firm* — IPro, PLLC

(57) ABSTRACT

The present disclosure provides a shift register unit, a gate driving circuitry and a method for driving the gate driving circuitry. The shift register unit includes an input circuitry, a first latch circuitry, a second latch circuitry and an output end. The input circuitry is configured to output an input control signal to the first latch circuitry in accordance with a first level signal, a second level signal and a first ON signal. The first latch circuitry is configured to output an
(Continued)

output signal as a gate driving signal via the output end in accordance with a first clock signal and the input control signal, and latch the output signal. The second latch circuitry is configured to output a second ON signal in accordance with a second clock signal and the output signal, and latch the second ON signal.

20 Claims, 3 Drawing Sheets

(51) Int. Cl.
  *G09G 3/3225* (2016.01)
  *G11C 19/28* (2006.01)
  *H03K 19/20* (2006.01)
(52) U.S. Cl.
  CPC ........... *G09G 2310/0286* (2013.01); *G09G 2310/0291* (2013.01); *G09G 2310/08* (2013.01); *H03K 19/20* (2013.01)
(58) Field of Classification Search
  CPC ....... G09G 2310/0291; G09G 2370/08; G09G 3/3266; G09G 3/3674; G09G 3/3688; G09G 2310/0297; G09G 2310/0289; G09G 3/3696; G09G 2310/08; G09G 2310/0243; G09G 2310/0262; G06F 3/04166; G11C 11/4093; G11C 7/1087; G11C 13/0061; G11C 19/00; G11C 19/28; G11C 11/40611; G11C 11/4076
  See application file for complete search history.

(56) References Cited

U.S. PATENT DOCUMENTS

| | | |
|---|---|---|
| 2006/0171501 A1* | 8/2006 | Lim .................. G11C 19/00 377/64 |
| 2011/0199353 A1 | 8/2011 | Chung |
| 2013/0257703 A1 | 10/2013 | Huang |
| 2015/0228354 A1 | 8/2015 | Qing et al. |
| 2015/0248867 A1 | 9/2015 | Tan et al. |
| 2016/0343451 A1 | 11/2016 | Hao |
| 2016/0365050 A1 | 12/2016 | Qing et al. |
| 2017/0040068 A1 | 2/2017 | Hao |
| 2017/0103722 A1 | 4/2017 | Song et al. |
| 2017/0365220 A1 | 12/2017 | Huang et al. |

FOREIGN PATENT DOCUMENTS

| | | |
|---|---|---|
| CN | 103345911 A | 10/2013 |
| CN | 104361875 A | 2/2015 |
| CN | 104537995 A | 4/2015 |
| CN | 104658508 A | 5/2015 |
| CN | 105096864 A | 11/2015 |
| EP | 3657485 A1 | 5/2020 |

* cited by examiner

SHIFT REGISTER UNIT, GATE DRIVING CIRCUITRY AND METHOD FOR DRIVING THE SAME

CROSS-REFERENCE TO RELATED APPLICATION

This application claims a priority of the Chinese patent application No. 202011486516.3 filed on Dec. 16, 2020, which is incorporated herein by reference in its entirety.

TECHNICAL FIELD

The present disclosure relates to the field of display technology, in particular to a shift register unit, a gate driving circuitry and a method for driving the gate driving circuitry.

BACKGROUND

In the display field, especially in a large-size Organic Light-Emitting Diode (OLED) display, usually a gate driving circuitry is used to reduce a manufacture cost. Along with the development of the process, N-type Thin Film Transistors (TFTs) and P-type TFTs have increasingly applied in a panel process simultaneously.

SUMMARY

In one aspect, the present disclosure provides in some embodiments a shift register unit, including an input circuitry, a first latch circuitry, a second latch circuitry and an output end. The input circuitry is configured to output an input control signal to the first latch circuitry in accordance with a first level signal, a second level signal and a first ON signal. The first latch circuitry is configured to output an output signal as a gate driving signal via the output end in accordance with a first clock signal and the input control signal, and latch the output signal. The second latch circuitry is configured to output a second ON signal in accordance with a second clock signal and the output signal, and latch the second ON signal.

In a possible embodiment of the present disclosure, the first latch circuitry includes a first input control circuitry and a first latch. The first input control circuitry is configured to output a first control signal to the first latch in accordance with the first clock signal, and the first latch is configured to output the output signal in accordance with the first control signal and latch the output signal.

In a possible embodiment of the present disclosure, the first input control circuitry includes a first phase inverter, and the first latch includes a second phase inverter and a third phase inverter. The first phase inverter includes an input end, a first clock signal end and an output end, the input end of the first phase inverter is coupled to the input circuitry, the output end of the first phase inverter is coupled to a first node, and the first phase inverter is configured to invert a phase of the input control signal in response to the first clock signal from the first clock signal end to form the first control signal and output the first control signal to the first node. The second phase inverter includes an input end and an output end, the input end of the second phase inverter is coupled to the first node, the output end of the second phase inverter is coupled to a second node, and the second phase inverter is configured to invert a phase of the first control signal to form the output signal and output the output signal to the second node. The third phase inverter includes an input end, a third clock signal end and an output end, the input end of the third phase inverter is coupled to the second node, the output end of the third phase inverter is coupled to the first node, and the third phase inverter is configured to invert a phase of the output signal in response to a phase-inverted signal of the first clock signal from the third clock signal end and output the phase-inverted output signal to the second phase inverter.

In a possible embodiment of the present disclosure, the shift register unit further includes at least one buffer circuitry configured to buffer the output signal, and the buffered output signal is outputted as the gate driving signal.

In a possible embodiment of the present disclosure, the buffer circuitry includes two or four phase inverters coupled sequentially.

In a possible embodiment of the present disclosure, the shift register unit further includes a gating switch configured to output the output signal in response to an enabling signal, and the gated output signal is outputted as the gate driving signal.

In a possible embodiment of the present disclosure, the gating switch is an NAND gate.

In a possible embodiment of the present disclosure, the second latch circuitry includes a second input control circuitry and a second latch. The second input control circuitry is configured to output a second control signal to the second latch in accordance with the second clock signal, and the second latch is configured to output a second ON signal in accordance with the second control signal and latch the second ON signal.

In a possible embodiment of the present disclosure, the second input control circuitry includes a fourth phase inverter, and the second latch includes a fifth phase inverter and a sixth phase inverter. The fourth phase inverter includes an input end, a fifth clock signal end and an output end, the input end of the fourth phase inverter is coupled to the second node, the output end of the fourth phase inverter is coupled to a third node, and the fourth phase inverter is configured to invert the phase of the output signal in response to the second clock signal from the fifth clock signal end to form the second control signal and output the second control signal to the third node. The fifth phase inverter includes an input end and an output end, the input end of the fifth phase inverter is coupled to the third node, the output end of the fifth phase inverter is coupled to a fourth node, and the fifth phase inverter is configured to invert a phase of the second control signal to form the second ON signal and output the second ON signal to the fourth node. The sixth phase inverter includes an input end, a seventh clock signal end and an output end, the input end of the sixth phase inverter is coupled to the fourth node, the output end of the sixth phase inverter is coupled to the third node, and the sixth phase inverter is configured to invert a phase of the second ON signal in response to a phase-inverted signal of the second clock signal from the seventh clock signal end and output the phase-inverted second ON signal to the fifth phase inverter.

In a possible embodiment of the present disclosure, the input circuitry includes a transmission gate.

In a possible embodiment of the present disclosure, the input circuitry further includes a second transmission gate configured to output the input control signal to the first latch circuitry in accordance with the first level signal, the second level signal and a third ON signal, and the third ON signal and the first ON signal are signals provided at different times.

In a possible embodiment of the present disclosure, the first transmission gate includes a first control end, a second control end, a first input end and a first output end, the first control end is configured to receive the first level signal, the second control end is configured to receive the second level signal, the first input end is configured to receive the first ON signal, and the output end is coupled to the first latch circuitry. The second transmission gate includes a third control end, a fourth control end, a second input end and a second output end, the third control end is configured to receive the second level signal, the fourth control end is configured to receive the first level signal, the second input end is configured to receive the third ON signal, and the second output end is coupled to the first latch circuitry.

In another aspect, the present disclosure provides in some embodiments a gate driving circuitry including N cascaded shift register units. Apart from a first-level shift register unit, a first ON signal for an $n^{th}$-level shift register unit is a second ON signal from an $(n-1)^{th}$-level shift register unit, where n is an integer greater than or equal to 1 and smaller than or equal to N. When n is 1, the first ON signal is a circuitry ON signal applied to the gate driving circuitry, where N is an integer greater than or equal to 2.

In yet another aspect, the present disclosure provides in some embodiments a gate driving circuitry including N cascaded shift register units. Apart from a first-level shift register unit, a first ON signal for an $n^{th}$-level shift register unit is a second ON signal from an $(n-1)^{th}$-level shift register unit, and apart from a last-level shift register unit, a third ON signal for the $n^{th}$-level shift register unit is a second ON signal from an $(n+1)^{th}$-level shift register unit, where n is an integer greater than or equal to 1 and smaller than or equal to N. When n is 1, the first ON signal is a circuitry ON signal applied to the gate driving circuitry, where N is an integer greater than or equal to 2.

In yet another aspect, the present disclosure provides in some embodiments a method for driving the above-mentioned gate driving circuitry, including: outputting, by an input circuitry of the $n^{th}$-level shift register unit, an input control signal to a first latch circuitry in accordance with a first level signal, a second level signal and a first ON signal; outputting, by a first latch circuitry of the $n^{th}$-level shift register unit, an output signal as a gate driving signal in accordance with a first clock signal and the input control signal, and latching the output signal; and outputting, by a second latch circuitry of the $n^{th}$-level shift register unit, a second ON signal in accordance with a second clock signal and the output signal, and latching the second ON signal.

In a possible embodiment of the present disclosure, the first latch circuitry includes a first input control circuitry and a first latch, and the second latch circuitry includes a second input control circuitry and a second latch. The outputting, by the first latch circuitry of the $n^{th}$-level shift register unit, the output signal as the gate driving signal in accordance with the first clock signal and the input control signal and latching the output signal includes: outputting, by the first input control circuitry, a first control signal to the first latch in accordance with the first clock signal; and outputting, by the first latch, the output signal in accordance with the first control signal, and latching the output signal. The outputting, by the second latch circuitry of the $n^{th}$-level shift register unit, the second ON signal in accordance with the second clock signal and the output signal and latching the second ON signal includes: outputting, by the second input control circuitry, a second control signal to the second latch in accordance with the second clock signal; and outputting, by the second latch, the second ON signal in accordance with the second control signal, and latching the second ON signal.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in some embodiments a shift register unit, which includes an input circuitry, a first latch circuitry, a second latch circuitry, and an output end. The input circuitry is configured to output an input control signal to the first latch circuitry in accordance with a first level signal, a second level signal and a first ON signal. The first latch circuitry is configured to output an output signal as a gate driving signal via the output end in accordance with a first clock signal and the input control signal, and latch the output signal. The second latch circuitry is configured to output a second ON signal in accordance with a second clock signal and the output signal, and latch the second ON signal.

In the embodiments of the present disclosure, through the input circuitry, the first latch circuitry and the second latch circuitry, the ON signal may be determined by the input circuitry, and a timing for latching or outputting the ON signals may be controlled by the first latch circuitry and the second latch circuitry in accordance with the clock signals. As a result, it is able to achieve a shift register function through a simple circuitry structure, thereby to reduce the manufacture cost and provide a wide application prospect.

Figure 1:
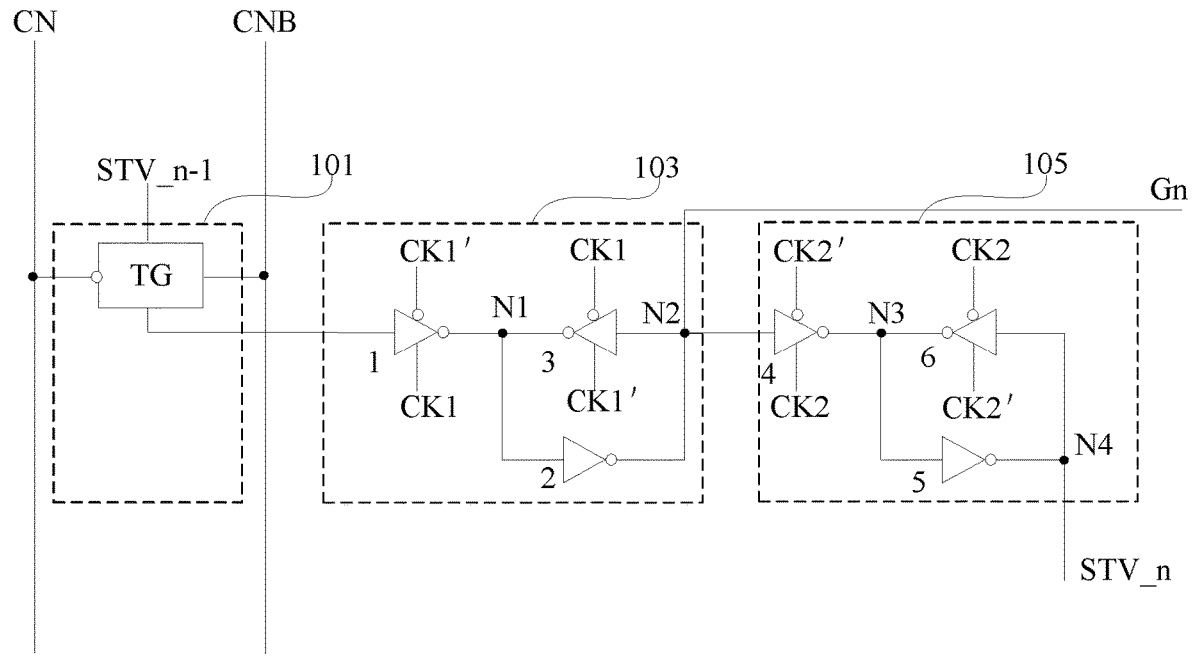
FIG. 1 is a schematic circuit diagram of a shift register unit according to one embodiment of the present disclosure.

In a specific embodiment of the present disclosure, as shown in FIG. 1, the shift register unit includes an input circuitry 101, a first latch circuitry 103 and a second latch circuitry 105. The input circuitry 101 is configured to output an input control signal (equal to STV_n−1) to the first latch circuitry 103 in accordance with a first level signal CN, a second level signal CNB and a first ON signal STV_n−1. The first latch circuitry 103 is configured to output an output signal in accordance with a first clock signal CK1 and the input control signal, and latch the output signal. The output signal is a signal applied to a node N2, and it is outputted as a gate driving signal Gn. The second latch circuitry 105 is configured to output a second ON signal STV_n in accordance with a second clock signal CK2 and the output signal, and latch the second ON signal STV_n. Through the above configurations, it is able to simplify a circuitry structure of the shift register unit, and output the second ON signal and the gate driving signal merely through the input circuitry, the first latch circuitry and the second latch circuitry.

In a possible embodiment of the present disclosure, the input circuitry 101 may include a first transmission gate. As shown in FIG. 1, the first transmission gate includes a first control end, a second control end, a first input end and a first output end. The first control end is configured to receive the first level signal CN, the second control end is configured to receive the second level signal CNB, the first input end is configured to receive the first ON signal STV_n−1, and the first output end is coupled to the first latch circuitry 103. When the first level signal CN is a low level and the second level signal CNB is a high level, the input circuitry 101 may output the input control signal to the first latch circuitry 103 via its output end.

In some embodiments of the present disclosure, the input circuitry may further include a second transmission gate configured to output the input control signal to the first latch circuitry in accordance with the first level signal, the second level signal and a third ON signal. The third ON signal and the first ON signal may be signals provided at different times.

In some embodiments of the present disclosure, the first transmission gate may include a first control end, a second control end, a first input end and a first output end. The first control end is configured to receive the first level signal, the second control end is configured to receive the second level signal, the first input end is configured to receive the first ON signal, and the output end is coupled to the first latch circuitry. The second transmission gate may include a third control end, a fourth control end, a second input end and a second output end. The third control end is configured to receive the second level signal, the fourth control end is configured to receive the first level signal, the second input end is configured to receive the third ON signal, and the second output end is coupled to the first latch circuitry.

Figure 2:
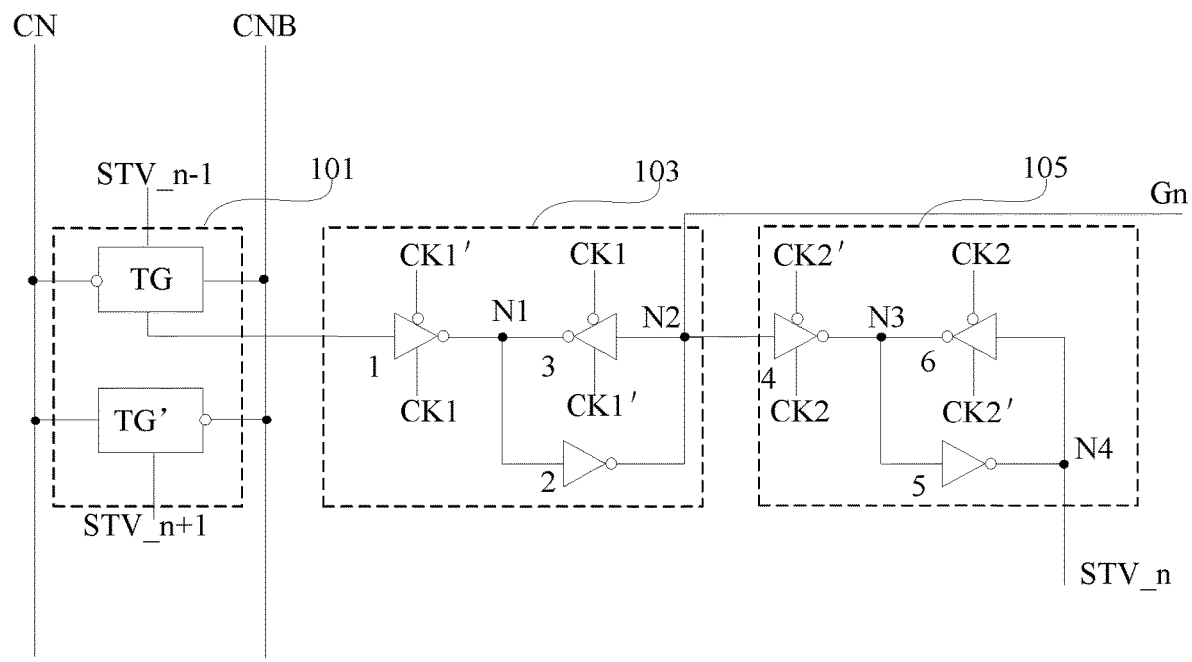
FIG. 2 is another schematic circuit diagram of the shift register unit according to one embodiment of the present disclosure.

As shown in FIG. 2, the input circuitry 101 further includes a second transmission gate TG' which includes a third control end, a fourth control end, a second input end and a second output end. The third control end is configured to receive the second level signal CNB, the fourth control end is configured to receive the first level signal CN, the second input end is configured to receive the third ON signal STV_n+1, and the second output end is coupled to the first latch circuitry 103.

In some embodiments of the present disclosure, the first transmission gate may be of a same type as the second transmission gate, so that the first transmission gate and the second transmission gate do not operate simultaneously under the control of the first level signal and the second level signal. For example, when the first level signal CN is a low level and the second level signal CNB is a high level, the first transmission gate may be turned on and the second transmission gate may be turned off.

Through the first transmission gate and the second transmission gate, a gate driving circuitry consisting of a plurality of the above-mentioned shift register units may perform scanning operations both in a forward direction and a backward direction, i.e., it may sequentially scan pixels in a first row, a second row, . . . , and an $n^{th}$ row, or sequentially scan the pixels in the $n^{th}$ row, an $(n−1)^{th}$ row, . . . , and the first row.

It should be appreciated that, the above is merely for illustrative purposes only, and in the embodiments of the present disclosure, a specific structural form of the transmission gate will not be particularly defined. In other words, neither the quantity of control ends nor the levels of the active signal for the outputted input control signal will be particularly defined, as long as the input signal STV_n−1 is outputted and selected in accordance with levels applied to the control ends.

To be specific, as shown in FIG. 1, the first latch circuitry 103 includes a first input control circuitry and a first latch. The first input control circuitry is configured to output a first control signal to the first latch in accordance with the first clock signal CK1, and the first control signal is a signal applied to a node N1. The first latch is configured to output the output signal in accordance with the first control signal and latch the output signal.

To be specific, the first input control circuitry may include a phase inverter 1, and the first latch may include a phase inverter 2 and a phase inverter 3.

The phase inverter 1 may include an input end, a first clock signal end and an output end, the input end of the phase inverter 1 may be coupled to the input circuitry 101, the first clock signal end of the phase inverter 1 may receive the first clock signal CK1, and the output end of the phase inverter 1 may be coupled to a first node N1. The phase inverter 1 is configured to invert a phase of the input control signal in response to the first clock signal CK1 from the first clock signal end to form the first control signal and output the first control signal to the first node N1. In addition, as shown in FIG. 1, the phase inverter 1 may further include a second clock signal end configured to receive a phase-inverted signal CK1' of the first clock signal. The phase inverter 1 in FIG. 1 is active at a high level, i.e., it may invert the phase of the input control signal from the input end in response to the first clock signal CK1 at a high level from the first clock signal end, and generate the first control signal.

The phase inverter 2 may include an input end and an output end, the input end of the phase inverter 2 may be coupled to the first node N1, and the output end of the phase inverter 2 may be coupled to a second node N2. The phase inverter 2 is configured to invert a phase of the first control signal to form the output signal and output the output signal to the second node N2.

The phase inverter 3 may include an input end, a third clock signal end and an output end, the input end of the phase inverter 3 may be coupled to the second node N2, the third clock signal end may receive the phase-inverted signal CK1' of the first clock signal, and the output end of the phase inverter 3 may be coupled to the first node N1. The phase inverter 3 is configured to invert a phase of the output signal in response to the phase-inverted signal CK1' of the first clock signal CK1 from the third clock signal end and output the phase-inverted output signal to the phase inverter 2. In addition, as shown in FIG. 1, the phase inverter 3 may further include a fourth clock signal end configured to receive the first clock signal CK1. The phase inverter 3 in FIG. 1 may be active at a high level, i.e., it may invert the phase of the output signal from the input end in response to the phase-inverted signal CK1' at a high level of the first clock signal from the third clock signal end, and input the phase-inverted output signal to the input end of the phase inverter 2, so as to latch the output signal through the cooperation of the phase inverter 2 with the phase inverter 3.

It should be appreciated that, although each of the phase inverter 1 and the phase inverter 3 includes two clock signal ends and is active at a high level as shown in FIG. 1, a specific structural form of each of them will not be particularly defined herein, i.e., each of the phase inverter 1 and the phase inverter 3 may also include merely one clock signal end. In addition, one or both of the phase inverter 1 and the phase inverter 3 may be active at a low level, as long as a level of the clock signal is changed in such a manner that the phase inverter 1 is switched from active to inactive and the phase inverter 3 is active.

To be specific, as shown in FIG. 1, the second latch circuitry 105 includes a second input control circuitry and a second latch. The second input control circuitry is configured to output a second control signal to the second latch in accordance with the second clock signal CK2, and the second latch is configured to output a second ON signal STV_n in accordance with the second control signal and latch the second ON signal STV_n.

To be specific, the second input circuitry 105 may include a phase inverter 4, and the second latch may include a phase inverter 5 and a phase inverter 6.

The phase inverter 4 may include an input end, a fifth clock signal end and an output end, the input end of the phase inverter 4 may be coupled to the second node N2, the fifth clock signal end may receive the second clock signal CK2, and the output end of the phase inverter 4 may be coupled to a third node N3. The phase inverter 4 is configured to invert the phase of the output signal in response to the second clock signal CK2 from the fifth clock signal end to form the second control signal and output the second control signal to the third node N3. In addition, as shown in FIG. 1, the phase inverter 4 may further include a sixth clock signal end configured to receive a phase-inverted signal CK2' of the second clock signal. The phase inverter 4 in FIG. 1 may be active at a high level, i.e., it may invert the phase of the output signal from the input end in response to the second clock signal CK2 at a high level from the first clock signal end, and generate the second control signal.

The phase inverter 5 may include an input end and an output end, the input end of the phase inverter 5 may be coupled to the third node N3, and the output end of the phase inverter 5 may be coupled to a fourth node N4. The phase inverter 5 is configured to invert a phase of the second control signal to form the second ON signal and output the second ON signal STV_n to the fourth node N4.

The phase inverter 6 may include an input end, a seventh clock signal end and an output end, the input end of the phase inverter 6 may be coupled to the fourth node N4, the seventh clock signal may receive the phase-inverted signal CK2' of the second clock signal, and the output end of the phase inverter 6 may be coupled to the third node N3. The phase inverter 6 is configured to invert a phase of the second ON signal in response to the phase-inverted signal CK2' of the second clock signal from the seventh clock signal end and output the phase-inverted second ON signal to the phase inverter 5. In addition, as shown in FIG. 1, the phase inverter 6 may further include an eighth clock signal end configured to receive the second clock signal CK2. The phase inverter 6 in FIG. 1 may be active at a high level, i.e., it may invert the phase of the second ON signal STV_n from the input end in response to the phase-inverted signal CK2' at a high level of the second clock signal from the seventh clock signal end, and input the phase-inverted second ON signal to the input end of the phase inverter 5, so as to latch the second ON signal STV_n through the cooperation of the phase inverter 5 with the phase inverter 6.

It should be appreciated that, although each of the phase inverter 4 and the phase inverter 6 includes two clock signal ends and is active at a high level as shown in FIG. 1, a specific structural form of each of them will not be particularly defined herein, i.e., each of the phase inverter 4 and the phase inverter 6 may also include merely one clock signal end. In addition, one or both of the phase inverter 4 and the phase inverter 6 may be active at a low level, as long as a level of the clock signal is changed in such a manner that the phase inverter 4 is switched from active to inactive and the phase inverter 6 is active.

In a possible embodiment of the present disclosure, the shift register unit may further include a buffer circuitry configured to buffer the output signal, and the buffered output signal may be outputted as the gate driving signal Gn.

Through the buffer circuitry, it is able to enhance an output capability of the shift register unit.

In a possible embodiment of the present disclosure, the buffer circuitry may include two phase inverters coupled sequentially.

In other words, an input end of a first phase inverter of the buffer circuitry may serve as an input end of the buffer circuitry, an output end of the first phase inverter may be coupled to an input end of a second phase inverter, and an output end of the second phase inverter may serve as an output end of the buffer circuitry. Although the shift register unit includes two buffer circuitries in FIGS. 3-4, it should be appreciated that, the quantity of the buffer circuitries in the shift register unit will not be particularly defined herein, i.e., it may include one buffer circuitry, or more than two buffer circuitries. When the shift register unit includes a plurality of buffer circuitries, the buffer circuitries may be connected in series to each other.

Figure 3:
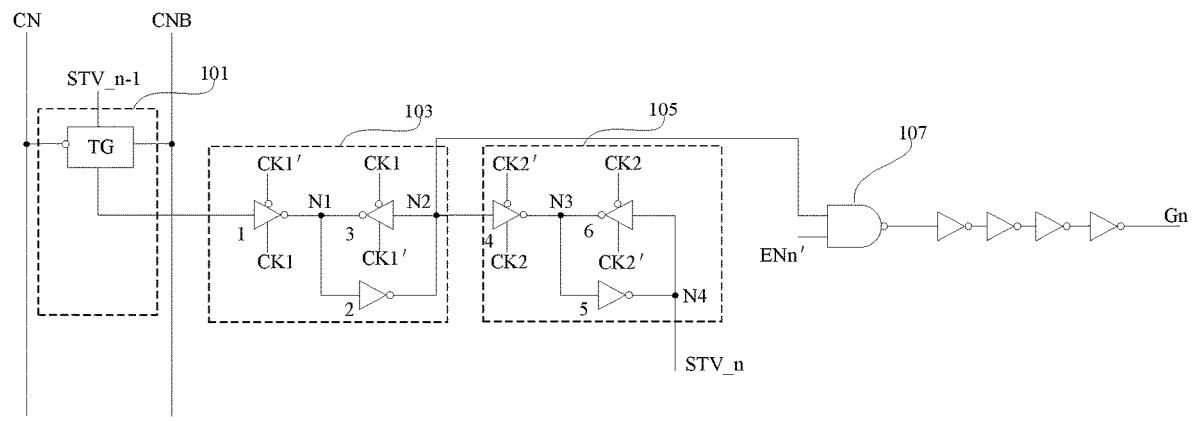
FIG. 3 is yet another schematic circuit diagram of the shift register unit according to one embodiment of the present disclosure.

In a possible embodiment of the present disclosure, as shown in FIG. 3, the shift register unit may further include a first gating switch 107 configured to output the output signal in response to an enabling signal EN', and the gated output signal may be outputted as the gate driving signal Gn.

Through the first gating switch, an additional Enable control end may be added, so as to enable the shift register to output or not output the output signal in accordance with the enabling signal, thereby to improve the flexibility of the shift register unit.

In a possible embodiment of the present disclosure, the first gate switch may be an NAND gate. Of course, it may also be any other logic gate having a gating function.

In some embodiments of the present disclosure, when the input circuitry of the shift register unit includes the first transmission gate and the second transmission gate, the shift register unit may further include a second gating switch 108 configured to output the output signal in response to a phase-inverted signal of the enabling signal EN'.

In some embodiments of the present disclosure, the second gating switch 108 may include an input end configured to receive a gate driving signal G(n+1) from an (n+1)$^{th}$-level shift register unit, and the second gating switch 108 may be located in an n$^{th}$-level shift register unit.

It should be appreciated that, the first gating switch 107 and the second gating switch 108 may not operate simultaneously, i.e., when the shift register unit operates, merely one of the first gating switch 107 and the second gating switch 108 may operate.

Figure 4:
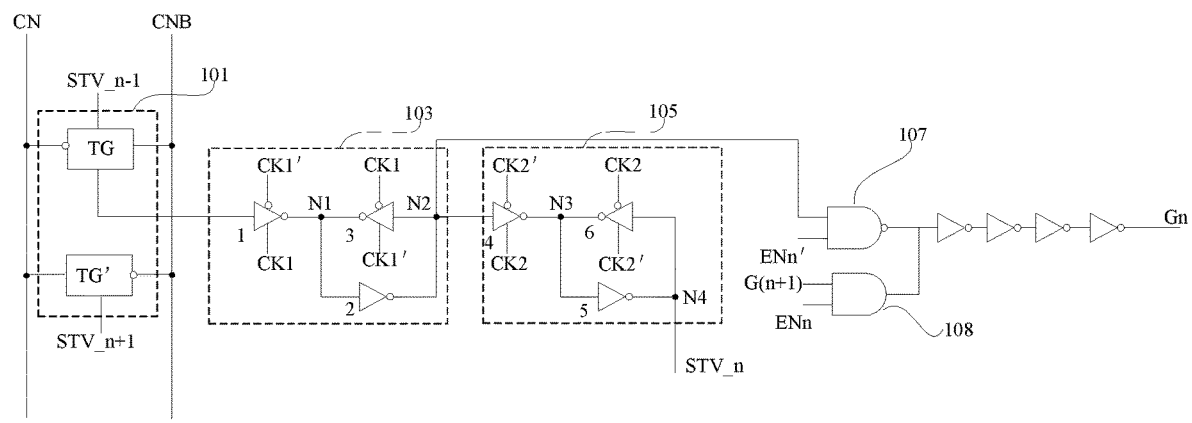
FIG. 4 is still yet another schematic circuit diagram of the shift register unit according to one embodiment of the present disclosure.

In addition, it should be appreciated that, although the shift register unit including the first gating switch 107 and the buffer circuitry is shown in FIG. 3 and the shift register unit including the first gating switch 107, the second gating switch 108 and the buffer circuitry is shown in FIG. 4, the present disclosure shall not be limited thereto, and the shift register unit may include merely the first gating switch or merely the buffer circuitry.

With respect to the entire implementation mode of the shift register unit, the following description will be given when the shift register units are cascaded. According to the embodiments of the present disclosure, the shift register unit merely needs to include the input circuitry, the first latch circuitry and the second latch circuitry, so as to achieve the shift register function with a simple circuitry structure. As a result, it is able to reduce the manufacture cost.

Correspondingly, the present disclosure further provides in some embodiments a gate driving circuitry including N cascaded shift register units mentioned hereinabove. Apart from a first-level shift register unit, a first ON signal for an n$^{th}$-level shift register unit is a second ON signal from an (n−1)$^{th}$-level shift register unit, where n is an integer greater than or equal to 1 and smaller than or equal to N. When n is 1, the first ON signal is a circuitry ON signal applied to the gate driving circuitry, where N is an integer greater than or equal to 2.

Figure 5:
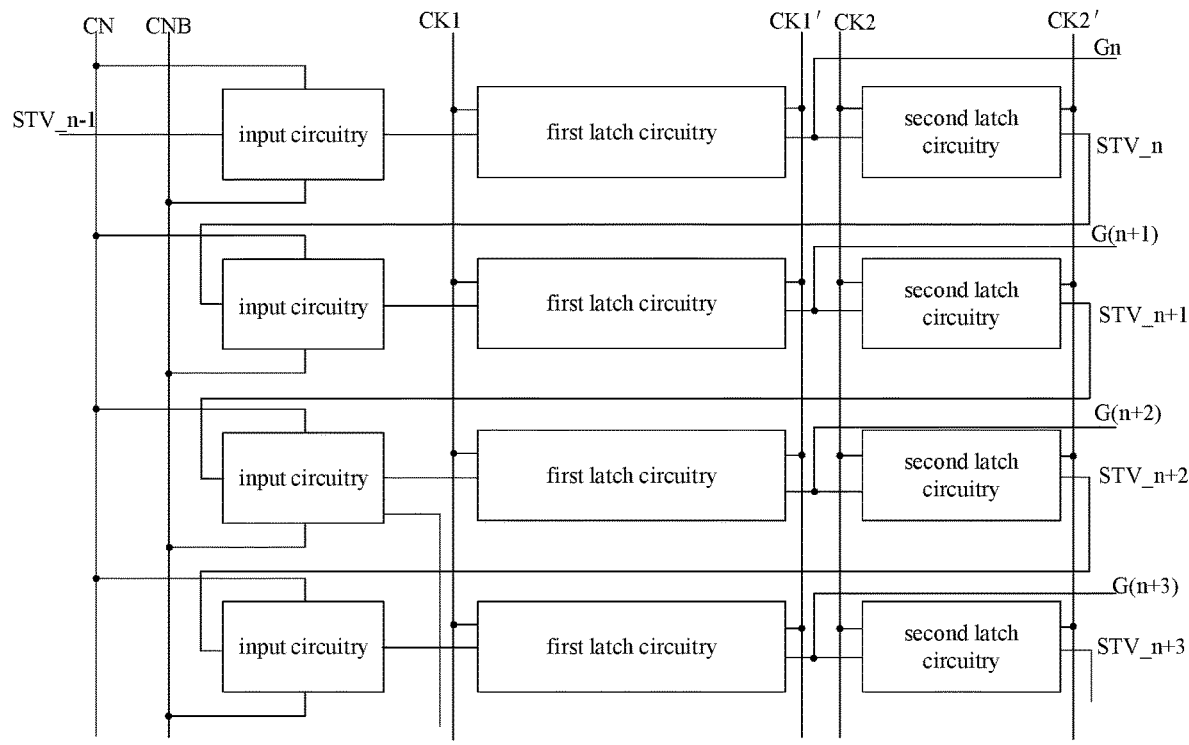
FIG. 5 is a block diagram of a gate driving circuitry according to one embodiment of the present disclosure.

To be specific, FIG. 5 shows the n$^{th}$-level shift register unit, an (n+1)$^{th}$-level shift register unit, an (n+2)$^{th}$-level shift register unit and an (n+3)$^{th}$-level shift register unit cascaded in the gate driving circuitry. It should be appreciated that, when Gn is the gate driving signal for driving the first-level shift register unit, STV_n−1 may be an initial ON signal applied separately, which will not be particularly defined herein.

The present disclosure further provides in some embodiments a gate driving circuitry including N cascaded shift register units in FIG. 4. Apart from a first-level shift register unit, a first ON signal for an n$^{th}$-level shift register unit is a second ON signal from an (n−1)$^{th}$-level shift register unit, and apart from a last-level shift register unit, a third ON signal for the n$^{th}$-level shift register unit is a second ON signal from an (n+1)$^{th}$-level shift register unit, where n is an integer greater than or equal to 1 and smaller than or equal to N. When n is 1, the first ON signal is a circuitry ON signal applied to the gate driving circuitry, where N is an integer greater than or equal to 2.

For example, when the input circuitry of the shift register unit further includes the second transmission gate and the shift register unit further includes the second gating switch, a first input end of a first transmission gate of the n$^{th}$-level shift register unit may receive a second ON signal STV_n−1 from the (n−1)$^{th}$-level shift register unit, a second input end of the second transmission gate of the n$^{th}$-level shift register unit may receive a second ON signal STV_n+1 from the (n+1)$^{th}$-level shift register unit, and a second gating switch of the n$^{th}$-level shift register unit may receive a gate driving signal G(n+1) from the (n+1)$^{th}$-level shift register unit.

The gate driving circuitry in the embodiments of the present disclosure may be used to perform scanning operations in both a forward direction and a backward direction, so as to be applied in more scenarios.

Figure 6:
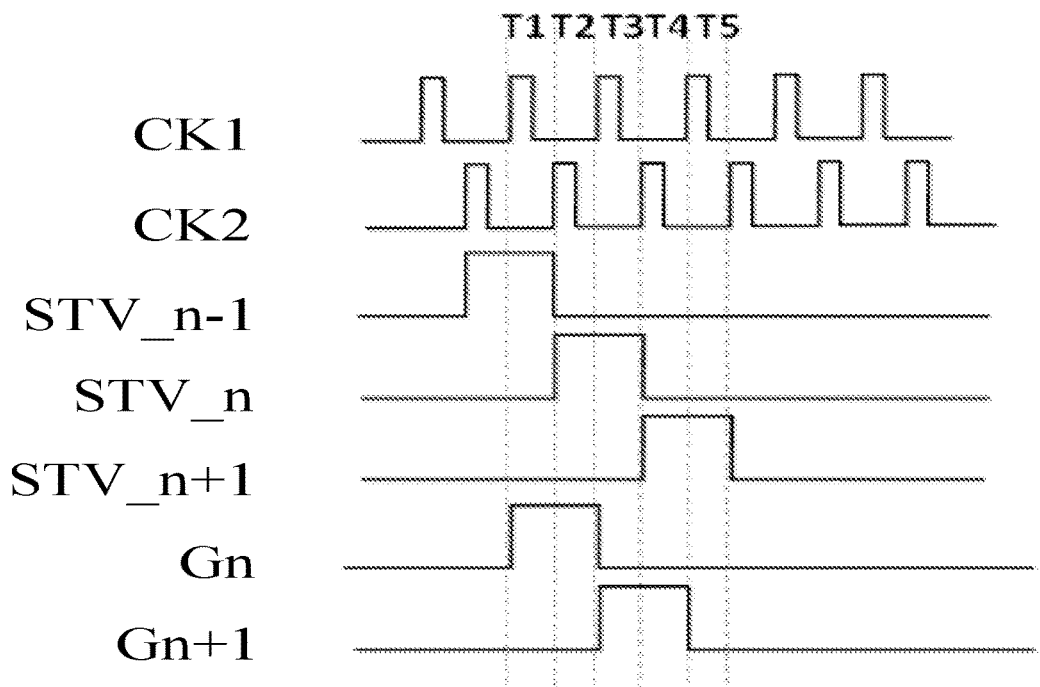
FIG. 6 is a sequence diagram of key signals for the shift register unit in FIG. 5.

In order to facilitate the understanding of the structures and functions of the shift register unit and the gate driving circuitry, a sequence relation of the gate driving circuitry in FIG. 5 consisting of the shift register units will be described hereinafter with reference to FIG. 6.

It should be appreciated that, in the sequence analysis, each of the cascaded shift register units may have a circuitry structure in FIG. 1. In addition, the first level signal CN may be a low level, and the second level signal CNB may be a high level, so the input control signal from the input circuitry 101 may be always equal to the first ON signal STV_n−1.

At a stage T1, the first clock signal CK1 may be switched between a high level and a low level, the second clock signal CK2 may be always a low level, the first ON signal STV_n−1 may be a high level, and the input control signal may be a high level. When the first clock signal CK1 is a high level, the output signal may be generated by the first latch circuitry 103 after the input control signal at a high level is applied to the first input control circuitry and the phase inverter 2 of the first latch. In other words, the gate driving signal Gn may be changed to a high level at a rising edge of CK1. In addition, at the stage T1, within a time period where the first clock signal CK1 is changed to a low level, the phase-inverted signal CK1' of the first clock signal may be changed to a high level, and the phase inverter 3 of the first latch may invert a phase of the output signal in response to the high-level phase-inverted signal CK1' of the first clock signal, and output the phase-inverted output signal to the phase inverter 2, so that the first latch may latch the output signal at the second node N2.

At a stage T2, the first clock signal CK1 may be always a low level, and the second clock signal CK2 may be switched between a high level and a low level. Because the phase inverter 3 is always active, the output signal at a high level may be maintained at the second node N2 through the cooperation of the phase inverter 2 and the phase inverter 3 of the first latch, i.e., the gate driving signal Gn may be always a high level at the stage T2. In addition, when the second clock signal CK2 is a high level, the second ON signal STV_n may be generated by the second latch circuitry 105 after the high-level output signal is applied to the second input control circuitry and the phase inverter 5 of the second latch. In addition, at the stage T2, within a time period where the second clock signal CK2 is changed to a low level, the phase-inverted signal CK2' of the second clock signal may be changed to a high level, and the phase inverter 6 of the second latch may invert a phase of the second ON signal STV_n in response to the high-level phase-inverted signal CK2' of the second clock signal and input the phase-inverted second ON signal to the phase inverter 5, so that the second latch may latch the second ON signal STV_n.

At a stage T3, the second clock signal CK2 may be always a low level, and the first clock signal CK1 may be switched between a high level and a low level. Because the phase inverter 6 is always active, the second ON signal STV_n may be maintained at a high level through the cooperation of the phase inverter 5 and the phase inverter 6 of the second latch, i.e., the first ON signal for the (n+1)$^{th}$-level shift register unit may be maintained at a high level. When the first clock signal CK1 is a high level, the output signal may be generated by the first latch circuitry 103 after the first ON signal STV_n−1 at a low level is applied to the first input control circuitry and the phase inverter 2 of the first latch. In other words, the gate driving signal Gn may be changed to a low level at the rising edge of CK1, and at this time a gate electrode has been driven through the $n^{th}$-level shift register unit. In addition, as mentioned hereinabove, because the second ON signal STV_n, which serves as the first ON signal for the $(n+1)^{th}$-level shift register unit, is maintained at a high level, and, for the $(n+1)^{th}$-level shift register unit, it is equivalent to that a procedure of the $n^{th}$-level shift register unit at the stage T1 is repeated.

At a stage T4, for the $(n+1)^{th}$-level shift register unit, it is equivalent to that a procedure of the $n^{th}$-level shift register unit at the stage T2 is repeated. In addition, at the stage T4, CK2 may be a high level, and STV_n may be reset to a low level under the effect of the low-level Gn.

At a stage T5, for the $(n+1)^{th}$-level shift register unit, it is equivalent to that a procedure of the $n^{th}$-level shift register unit at the stage T3 is repeated. At this time, the gate electrode has been driven through the $(n+1)^{th}$-level shift register unit.

For the $(n+2)^{th}$-level shift register unit and the $(n+3)^{th}$-level shift register unit, the above procedures may be repeated and thus will not be particularly defined herein.

The gate driving circuitry consisting of N cascaded shift register units in FIG. 4 may be used to perform scanning operations in both a forward direction and a backward direction. During the forward scanning, a same operating mode as that of the gate driving circuitry in FIG. 5 may be applied, and during the backward scanning, different ON signals may be inputted, and an operating mode may be similar to that mentioned hereinabove, which will not be particularly defined herein for clarification.

According to the embodiments of the present disclosure, the shift register unit may include the input circuitry, the first latch circuitry and the second latch circuitry, and the shift register units may be cascaded to form the gate driving circuitry. As a result, it is able to simplify a circuitry structure, thereby to provide the gate driving circuitry with a level-by-level gate driving function, reduce the manufacture cost, and provide a wide application prospect.

Based on a same inventive concept, the present disclosure further provides in some embodiments a method for driving the above-mentioned gate driving circuitry, which includes: outputting, by an input circuitry of the $n^{th}$-level shift register unit, an input control signal to a first latch circuitry in accordance with a first level signal, a second level signal and a first ON signal; outputting, by a first latch circuitry of the $n^{th}$-level shift register unit, an output signal as a gate driving signal in accordance with a first clock signal and the input control signal, and latching the output signal; and outputting, by a second latch circuitry of the $n^{th}$-level shift register unit, a second ON signal in accordance with a second clock signal and the output signal, and latching the second ON signal.

In a possible embodiment of the present disclosure, the first latch circuitry may include a first input control circuitry and a first latch, and the second latch circuitry may include a second input control circuitry and a second latch. The outputting, by the first latch circuitry of the $n^{th}$-level shift register unit, the output signal as the gate driving signal in accordance with the first clock signal and the input control signal and latching the output signal may include: outputting, by the first input control circuitry, a first control signal to the first latch in accordance with the first clock signal; and outputting, by the first latch, the output signal in accordance with the first control signal, and latching the output signal. The outputting, by the second latch circuitry of the $n^{th}$-level shift register unit, the second ON signal in accordance with the second clock signal and the output signal and latching the second ON signal may include: outputting, by the second input control circuitry, a second control signal to the second latch in accordance with the second clock signal; and outputting, by the second latch, the second ON signal in accordance with the second control signal, and latching the second ON signal.

According to the shift register unit, the gate driving circuitry and the method for driving the gate driving circuitry in the embodiments of the present disclosure, through the input circuitry, the first latch circuitry and the second latch circuitry, the ON signal may be determined by the input circuitry, and the timing for latching or outputting the ON signals may be controlled by the first latch circuitry and the second latch circuitry in accordance with the clock signals. As a result, it is able to achieve a shift register function through a simple circuitry structure, thereby to reduce the manufacture cost and provide a wide application prospect.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising an input circuitry, a first latch circuitry, a second latch circuitry and an output end, wherein
   the input circuitry is configured to output an input control signal to the first latch circuitry in accordance with a first level signal, a second level signal and a first ON signal;
   the first latch circuitry is configured to output an output signal as a gate driving signal via the output end in accordance with a first clock signal and the input control signal, and latch the output signal; and
   the second latch circuitry is configured to output a second ON signal in accordance with a second clock signal and the output signal, and latch the second ON signal.

2. The shift register unit according to claim 1, wherein the first latch circuitry comprises a first input control circuitry and a first latch, the first input control circuitry is configured to output a first control signal to the first latch in accordance with the first clock signal, and the first latch is configured to output the output signal in accordance with the first control signal and latch the output signal.

3. The shift register unit according to claim 2, wherein the first input control circuitry comprises a first phase inverter, and the first latch comprises a second phase inverter and a third phase inverter;
   the first phase inverter comprises an input end, a first clock signal end and an output end, the input end of the first phase inverter is coupled to the input circuitry, the output end of the first phase inverter is coupled to a first node, and the first phase inverter is configured to invert a phase of the input control signal in response to the first clock signal from the first clock signal end to form the first control signal and output the first control signal to the first node;
   the second phase inverter comprises an input end and an output end, the input end of the second phase inverter is coupled to the first node, the output end of the second phase inverter is coupled to a second node, and the second phase inverter is configured to invert a phase of the first control signal to form the output signal and output the output signal to the second node; and the third phase inverter comprises an input end, a third clock signal end and an output end, the input end of the third phase inverter is coupled to the second node, the output end of the third phase inverter is coupled to the first node, and the third phase inverter is configured to invert a phase of the output signal in response to a phase-inverted signal of the first clock signal from the third clock signal end and output the phase-inverted output signal to the second phase inverter.

4. The shift register unit according to claim 3, further comprising at least one buffer circuitry configured to buffer the output signal, wherein the buffered output signal is outputted as the gate driving signal.

5. The shift register unit according to claim 4, wherein the buffer circuitry comprises two phase inverters coupled sequentially.

6. The shift register unit according to claim 3, further comprising a gating switch configured to output the output signal in response to an enabling signal, wherein the gated output signal is outputted as the gate driving signal.

7. The shift register unit according to claim 6, wherein the gating switch is an NAND gate.

8. The shift register unit according to claim 3, wherein the second latch circuitry comprises a second input control circuitry and a second latch, the second input control circuitry is configured to output a second control signal to the second latch in accordance with the second clock signal, and the second latch is configured to output a second ON signal in accordance with the second control signal and latch the second ON signal.

9. The shift register unit according to claim 8, wherein the second input control circuitry comprises a fourth phase inverter, and the second latch comprises a fifth phase inverter and a sixth phase inverter;

the fourth phase inverter comprises an input end, a fifth clock signal end and an output end, the input end of the fourth phase inverter is coupled to the second node, the output end of the fourth phase inverter is coupled to a third node, and the fourth phase inverter is configured to invert the phase of the output signal in response to the second clock signal from the fifth clock signal end to form the second control signal and output the second control signal to the third node;

the fifth phase inverter comprises an input end and an output end, the input end of the fifth phase inverter is coupled to the third node, the output end of the fifth phase inverter is coupled to a fourth node, and the fifth phase inverter is configured to invert a phase of the second control signal to form the second ON signal and output the second ON signal to the fourth node; and the sixth phase inverter comprises an input end, a seventh clock signal end and an output end, the input end of the sixth phase inverter is coupled to the fourth node, the output end of the sixth phase inverter is coupled to the third node, and the sixth phase inverter is configured to invert a phase of the second ON signal in response to a phase-inverted signal of the second clock signal from the seventh clock signal end and output the phase-inverted second ON signal to the fifth phase inverter.

10. The shift register unit according to claim 9, further comprising a gating switch configured to output the output signal in response to an enabling signal, wherein the gated output signal is outputted as the gate driving signal.

11. The shift register unit according to claim 10, wherein the gating switch is an NAND gate.

12. The shift register unit according to claim 11, further comprising at least one buffer circuitry configured to buffer the output signal, wherein the buffered output signal is outputted as the gate driving signal.

13. The shift register unit according to claim 12, wherein the buffer circuitry comprises two phase inverters coupled sequentially.

14. The shift register unit according to claim 1, wherein the input circuitry comprises a transmission gate.

15. The shift register unit according to claim 14, wherein the input circuitry further comprises a second transmission gate configured to output the input control signal to the first latch circuitry in accordance with the first level signal, the second level signal and a third ON signal, and the third ON signal and the first ON signal are signals provided at different times.

16. The shift register unit according to claim 15, wherein the first transmission gate comprises a first control end, a second control end, a first input end and a first output end, the first control end is configured to receive the first level signal, the second control end is configured to receive the second level signal, the first input end is configured to receive the first ON signal, and the output end is coupled to the first latch circuitry; and the second transmission gate comprises a third control end, a fourth control end, a second input end and a second output end, the third control end is configured to receive the second level signal, the fourth control end is configured to receive the first level signal, the second input end is configured to receive the third ON signal, and the second output end is coupled to the first latch circuitry.

17. A gate driving circuitry, comprising N cascaded shift register units according to claim 1, wherein apart from a first-level shift register unit, a first ON signal for an $n^{th}$-level shift register unit is a second ON signal from an $(n-1)^{th}$-level shift register unit, where n is an integer greater than or equal to 1 and smaller than or equal to N, wherein when n is 1, the first ON signal is a circuitry ON signal applied to the gate driving circuitry, where N is an integer greater than or equal to 2.

18. A gate driving circuitry, comprising N cascaded shift register units according to claim 16, wherein apart from a first-level shift register unit, a first ON signal for an $n^{th}$-level shift register unit is a second ON signal from an $(n-1)^{th}$-level shift register unit, and apart from a last-level shift register unit, a third ON signal for the $n^{th}$-level shift register unit is a second ON signal from an $(n+1)^{th}$-level shift register unit, where n is an integer greater than or equal to 1 and smaller than or equal to N, wherein when n is 1, the first ON signal is a circuitry ON signal applied to the gate driving circuitry, where N is an integer greater than or equal to 2.

19. A method for driving the gate driving circuitry according to claim 17, comprising:

outputting, by an input circuitry of the $n^{th}$-level shift register unit, an input control signal to a first latch circuitry in accordance with a first level signal, a second level signal and a first ON signal;

outputting, by a first latch circuitry of the $n^{th}$-level shift register unit, an output signal as a gate driving signal in accordance with a first clock signal and the input control signal, and latching the output signal; and outputting, by a second latch circuitry of the $n^{th}$-level shift register unit, a second ON signal in accordance with a second clock signal and the output signal, and latching the second ON signal.

20. The method according to claim 19, wherein the first latch circuitry comprises a first input control circuitry and a first latch, and the second latch circuitry comprises a second input control circuitry and a second latch, wherein the outputting, by the first latch circuitry of the $n^{th}$-level shift register unit, the output signal as the gate driving signal in accordance with the first clock signal and the input control signal and latching the output signal comprises: outputting, by the first input control circuitry, a first control signal to the first latch in accordance with the first clock signal; and outputting, by the first latch, the output signal in accordance with the first control signal, and latching the output signal, wherein the outputting, by the second latch circuitry of the $n^{th}$-level shift register unit, the second ON signal in accordance with the second clock signal and the output signal and latching the second ON signal comprises: outputting, by the second input control circuitry, a second control signal to the second latch in accordance with the second clock signal; and outputting, by the second latch, the second ON signal in accordance with the second control signal, and latching the second ON signal.

\* \* \* \* \*